United States Patent [19]

Arima et al.

[11] Patent Number: 4,983,547
[45] Date of Patent: Jan. 8, 1991

[54] METHOD OF FORMING A SILICIDE FILM

[75] Inventors: Junichi Arima; Yoshihiro Hirata; Hiroshi Harada; Isao Furuta; Shigeru Harada; Reiji Tamaki, all of Itami, Japan

[73] Assignee: Mitsubishi Denki Kabushiki Kaisha, Japan

[21] Appl. No.: 260,390

[22] Filed: Oct. 20, 1988

Related U.S. Application Data

[63] Continuation of Ser. No. 927,379, Nov. 6, 1986, abandoned.

[30] Foreign Application Priority Data

Nov. 9, 1985 [JP] Japan .................... 60-251061

[51] Int. Cl.$^5$ .......................................... H01L 21/283
[52] U.S. Cl. .................... 437/246; 437/200; 437/199; 148/DIG. 147
[58] Field of Search ............... 437/192, 200, 187, 188, 437/228, 245, 246, 199; 148/DIG. 147

[56] References Cited

U.S. PATENT DOCUMENTS

| | | | |
|---|---|---|---|
| 4,332,839 | 6/1982 | Levinstein et al. | 427/85 |
| 4,337,476 | 6/1982 | Fraser et al. | 357/67 |
| 4,443,930 | 4/1984 | Hwang et al. | 29/571 |

FOREIGN PATENT DOCUMENTS

| | | |
|---|---|---|
| 1157581 | 7/1969 | United Kingdom . |
| 2128636 | 5/1984 | United Kingdom . |

OTHER PUBLICATIONS

Cooke, M. J., "A Review of LPCVD ...", J. Vac. Sci. and Tech., vol. 35, No. 2, Feb. 1985, pp. 67–73.
Van Gurp et al, "Aluminum-Silicide Reactions I. Diffusion, Compound Formation, and Microstructure", 50 J. Appl. Phys. 6915 (1979).
Hess, D. W., "Plasma Etching ...", Solid State Technology, Apr. 1981, pp. 189–194.
Reichelderfer, R. F., "Single Wafer ...", Solid State Technology, Apr. 1982, 6 pages.
Murarka, S. P., "Silicides for VLSI Applications", Academic Press, (1983), pp. 46–49, p. 124, pp. 156–167, and pp. 174–177.
Ho, P. S., IBM Technical Disclosure Bulletin, vol. 25, No. 3A, Aug. 1982, pp. 1177–1178.

Primary Examiner—Brian E. Hearn
Assistant Examiner—T. N. Quach
Attorney, Agent, or Firm—Saidman, Sterne, Kessler & Goldstein

[57] ABSTRACT

In a method of forming a metallic silicide film on a substrate, a metallic silicide film containing silicon at a concentration higher than stoichiometric, is deposited on a substrate. A film of aluminum or aluminum alloy is then deposited on the metallic silicide film. Subsequently, a heat treatment is conducted to cause precipitation of silicon from the metallic silicide film to the aluminum, thereby to lower the silicon concentration in the silicide film.

21 Claims, 1 Drawing Sheet

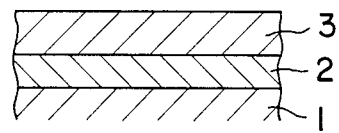
F I G. 1
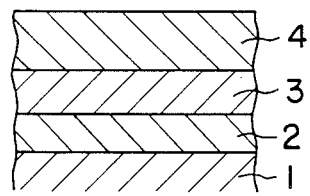   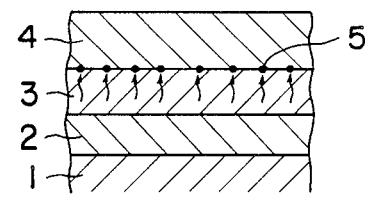
F I G. 2a          F I G. 2b
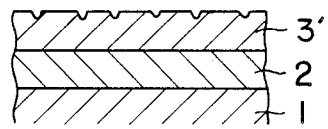
F I G. 2c

METHOD OF FORMING A SILICIDE FILM

This application is a continuation of application Ser. No. 927,379, filed Nov. 6, 1986 now abandoned.

BACKGROUND OF THE INVENTION

The present invention relates to a method of forming a film of metallic silicide, particularly high melting point metallic silicide, and particularly to a method of controlling the composition ratio of metal and silicon.

FIG. 1 shows a thin film 3 of MoSix, an example of a high melting point metal used in fabrication of an LSI device formed by sputtering ontoi an oxide film 2 which in turn is formed on an Si wafer 1.

The composition ratio between Mo and Si of the MoSi thin film 3 formed by sputtering on the oxide film 2 is determined mainly on the composition ratio between Mo and Si of the target.

A stable composition is obtained when the ratio of Si/Mo atoms is at 2. But, the Si/Mo composition ratio of the MoSi film as a part of a semiconductor device is set to be within a range of from 2:1 to 3:1. This is because the excessive Si in the MoSi film will cause a favorable stress, and thereby prevent peeling-off of the MoSi film, which may otherwise occur during heat treatment for recrystallization of the MoSi deposited by sputtering on an Si wafer. But as the ratio of Si/Mo atoms is set to b 2.0 through 3.0, the film resistivity is much higher than the silicide film with stoichiometry, i.e., of the ratio of 2.0. The resistivity of the conductor is therefore higher, and the operation speed of the LSI is lowered.

SUMMARY OF THE INVENTION

An object of the invention is to enable reduction of the concentration of Si in a silicide film, without causing the peeling-off of the silicide film during the heat treatment after sputtering, thereby to reduce the resistivity of the silicide film.

According to one aspect of the invention, there is provided a method of forming a metallic silicide film on a substrate, comprising the steps of depositing, on a substrate, a metallic silicide film containing silicon at a concentration higher than stoichiometry.

depositing a film of aluminum or aluminum alloy on the metallic silicide film, and conducting a heat treatment to cause precipitation of silicon from the metallic silicide film to the aluminum.

According to another aspect of the invention, there is provided a method of controlling the composition ratio of a metallic silicide film, comprising the steps of depositing a film of aluminum or aluminum alloy on a metallic silicide film, and conducting a heat treatment to cause precipitation of silicon from the metallic silicide film to the aluminum.

During the heat treatment, the excess Si in the silicide film is transported to the A1, so that the concentration of Si in the silicide film is reduced.

BRIEF DESCRIPTION OF THE DRAWINGS

In the accompanying drawings:

FIG. 1 is a sectional view showing a silicide film formed on a substrate;

FIG. 2a is a sectional view showing A1 deposited on a silicide film;

FIG. 2b is a sectional view showing Si precipitated to the A1 film by a heat treatment; and FIG. 2c is a sectional view showing the silicide film on a substrate, from which the A1 film and the precipitated Si have been removed.

DETAILED DESCRIPTION OF THE PREFERRED EMBODIMENTS

An embodiment of the invention is now described with reference to FIGS. 2a through 2c.

First, a structure similar to that shown in FIG. 1 is prepared. This may be achieved in a manner similar to that described with reference to FIG. 1.

Subsequently, A1 is deposited, by evaporation or sputtering, on the MoSix film 3, to form a film 4 of a thickness of about 0.5 to a few microns.

Then, a heat treatment is conducted, at a temperature of 350 to 550° C. and in an atmosphere of nitrogen $N_2$ or hydrogen $H_2$, and for a period of a few minutes to a few hours. By this hear treatment, Si in the MoSix film 3 is precipitated to the A1 film 4. The precipitated Si is indicated by numeral 5 in FIG. 2b.

Then the A1 film 4 and the precipitated Si 5 are removed, so that a structure as shown in FIG. 2c is obtained. The composition ratio of Si to Mo int he resultant MoSix film 3' is lower than in the film 3 of FIG. 1, i.e., of the film just after the sputtering of the Mo and Si. As a result, the resistivity of the MoSi film is lowered.

The A1 film 4 may be selectively formed. In other words, the A1 film may be formed to have any desired pattern. In that case, only that part of the MoSix film 3 which is under the pattern of the A1 film will undergo precipitation, and the resultant MoSix film will have a lower concentration of Si and hence lower resistivity in the selected area, i.e., the area which was under the pattern of the A1 film.

The invention is applicable to other silicide such as WSix, and TiSix and TaSix.

In the embodiment described, the silicide film is formed on a semiconductor substrate, but the invention is applicable to a situation where a silicide film is formed in a metallic product.

What is claimed is:

1. A method of forming and controlling the composition ratio of a metallic silicide film on a substrate, the method comprising the steps of:
   (a) sputtering $MoSi_x$ with $2 \leq x \leq 3$ onto the substrate to form a $MoSi_x$ layer at a concentration higher than stoichiometric;
   (b) depositing a film of either aluminum or aluminum alloy at selected areas on said $MoSi_x$ layer where a more nearly stoichiometric composition is desired;
   (c) conducting a heat treatment at a temperature between about 350° and about 550° C. to cause precipitation of Si from said $MoSi_x$ layer to said film at said selected areas; and
   (d) stripping said film having precipitated Si thereby leaving said $MoSi_x$ layer with said selected areas having said more nearly stoichiometric composition.

2. The method of claim 1, wherein said heat treatment is conducted in either a hydrogen atmosphere or in a nitrogen atmosphere.

3. The method of claim 1, wherein said substrate comprises a Si wafer.

4. The method of claim 1, wherein said substrate comprises any semiconductor.

5. The method of claim 1, wherein said substrate comprises a metallic product.

6. The method of claim 1, wherein said MoSi$_x$ layer is predominantly deposited over an insulating layer at the surface of said substrate.

7. The method of claim 1, wherein said film is deposited to a thickness of greater than about 0.5 microns.

8. A method of forming and controlling the composition ratio of a metallic silicide film on a substrate, the method comprising the steps of:
   (a) sputtering WSi$_x$ with $2 \leq x \leq 3$ onto the substrate to form a WSi$_x$ layer at a concentration higher than stoichiometric;
   (b) depositing a film of either aluminum or aluminum alloy at selected areas on said WSi$_x$ layer where a more nearly stoichiometric composition is desired;
   (c) conducting a heat treatment at a temperature between about 350° and about 550° C. to cause precipitation of Si from said WSi$_x$ layer to said film at said selected areas; and
   (d) stripping said film having precipitated Si thereby leaving said WSi$_x$ layer with said selected areas having said more nearly stoichiometric composition.

9. The method of claim 8, wherein said heat treatment is conducted in either a hydrogen atmosphere or in a nitrogen atmosphere.

10. The method of claim 8, wherein said substrate comprises a Si wafer.

11. The method of claim 8, wherein said substrate comprises any semiconductor.

12. The method of claim 8, wherein said substrate comprises a metallic product.

13. The method of claim 8, wherein said WSi$_x$ layer is predominantly deposited over an insulating layer at the surface of said substrate.

14. The method of claim 8, wherein said film is deposited to a thickness of greater than about 0.5 microns.

15. A method of forming and controlling the composition ratio of a metallic silicide film on a substrate, the method comprising the steps of:
   (a) sputtering TaSi$_x$ with $2 \leq x \leq 3$ onto the substrate to form a TaSi$_x$ layer at a concentration higher than stoichiometric;
   (b) depositing a film of either aluminum or aluminum alloy at selected areas on said TaSi$_x$ layer where a more nearly stoichiometric composition is desired;
   (c) conducting a heat treatment at a temperature between about 350° and about 550° C. to cause precipitation of Si from said Tasi$_x$ layer to said film at said selected areas; and
   (d) stripping said film having precipitated Si thereby leaving said WSi$_x$ layer with said selected areas having said more nearly stoichiometric composition.

16. The method of claim 15, wherein said heat treatment is conducted in either a hydrogen atmosphere or in a nitrogen atmosphere.

17. The method of claim 15, wherein said substrate comprises a Si wafer.

18. The method of claim 15, wherein said substrate comprises any semiconductor.

19. The method of claim 15, wherein said substrate comprises a metallic product.

20. The method of claim 15, wherein said TaSi$_x$ layer is predominantly deposited over an insulating layer at the surface of said substrate.

21. The method of claim 15, wherein said film is deposited to a thickness of greater than about 0.5 microns.

* * * * *